United States Patent [19]

Shinohara

[11] Patent Number: 5,026,669
[45] Date of Patent: Jun. 25, 1991

[54] METHOD OF ELUMINATING BURRS ON A LEAD FRAME WITH A THIN METAL COATING

[75] Inventor: Toshiaki Shinohara, Hyogo, Japan

[73] Assignee: Mitsubishi Denki Kabushiki Kaisha, Tokyo, Japan

[21] Appl. No.: 315,054

[22] Filed: Feb. 24, 1989

Related U.S. Application Data

[62] Division of Ser. No. 108,907, Oct. 13, 1987, Pat. No. 4,942,455.

[30] Foreign Application Priority Data

Oct. 13, 1986 [JP] Japan .................................. 61-243612

[51] Int. Cl.$^5$ ..................... H01L 21/56; H01L 23/495
[52] U.S. Cl. ..................................... 437/224; 437/246; 437/946; 437/974
[58] Field of Search ............... 437/207, 211, 217, 219, 437/220, 245, 246, 946, 974

[56] References Cited

U.S. PATENT DOCUMENTS 4,441,118  4/1984  Fister et al. .
4,625,228  11/1986  Bischoff et al. .
4,750,029  6/1988  Futatsuka et al. .
4,768,077  8/1988  Scherer .

FOREIGN PATENT DOCUMENTS 52-42372   1/1977   Japan .
53-32675   3/1978   Japan .
53-145473  12/1978  Japan .
57-79653   5/1982   Japan .
57-202766  12/1982  Japan .
59-175130  10/1984  Japan .................................. 437/211
60-154650  8/1985   Japan .
62-85453   4/1987   Japan .

Primary Examiner—Olik Chaudhuri
Assistant Examiner—David E. Graybill
Attorney, Agent, or Firm—Lowe, Price, Leblanc, Becker & Shur

[57] ABSTRACT

A lead frame for a semiconductor device and a method for manufacturing the semiconductor device using the frame, the lead frame comprising a dice pad, inner leads, tie bar, outer leads and a thin metal layer of lead which is hard to melt and is easily transformed formed on the surface of that portion of the inner leads, outer leads and the tie bar which is not covered with the sealing resin. In injection molding of a resin material on the lead frame with a semiconductor chip therein, the gap between the lead frame and the mold is filled while the thin metal layer is transformed by the clamping pressure so that the bur may be prevented from being generated.

3 Claims, 5 Drawing Sheets

METHOD OF ELIMINATING BURRS ON A LEAD FRAME WITH A THIN METAL COATING

This is a division of application Ser. No. 07/108,907 filed Oct. 13, 1987, now U.S. Pat. No. 4,942,455.

BACKGROUND OF THE INVENTION

1. Field of the Invention

The present invention relates to a lead frame for a semiconductor device and a method for manufacturing a semiconductor device using the lead frame and, more specifically, it relates to a lead frame employed in a method for manufacturing a resin-sealed type semiconductor device and to a method for manufacturing a semiconductor device using the lead frame.

2. Description of the Prior Art

FIG. 1 shows a lead frame employed in a method of manufacturing a conventional integrated circuit. The lead frame has a prescribed pattern which is formed by etching or pressing a thin metal plate Referring to the figure, a tie bar 1 connects outer leads 2. Inner leads 3 extend to the side of a central die pad 4 and after sealing, they will be contained in the resin. Meanwhile, hatched portions in the figure show the Ag or Au plated portions which facilitate the junction of semiconductor chips and the connection by Au wire, etc., between the electrodes of the semiconductor chip and the inner leads 3.

Referring to FIG. 2, a chip 5 is attached to the die pad 4 and the electrodes of the chip 5 and the inner leads 3 are in electrical connection to each other by fine lead wires 6 of, for example, Au. After the structure of FIG. 2 is obtained, a lead frame 11 is interposed between the upper mold 9 and the lower mold 10 of an injection mold, as shown in FIG. 3. Then, a thermosetting resin such as epoxy resin is injected to the cavity using the low pressure transfer molding, etc., to form a resin layer 8. The molded frame is shown in FIG. 4.

A thin film 12 (hereinafter referred to as a bur) which is formed by the resin entered the gap between the mold and the frame. The bur 12 occurs according to the flatness precision of the mold, the dispersion of plate thickness of the lead frame, uniformity of pressure of the press clamping the mold, the fluidity of the sealing resin and the die ware due to the frame treatment. The bur causes an inconvenience in that the plating can not be carried out on the outer lead in a subsequent process. Therefore, the bur 12 is eliminated by dry honing or the wet honing after molding. In addition, a bur eliminating method using high water pressure is employed after the electrolytic flash cutting.

A conventional lead frame is formed as described above. However, the bur eliminating process as above is essentially an undesired one. Meanwhile, when the honing is carried out, a package as well as the bur is damaged, the surface of the lead frame is made rough and the frame becomes slender, causing a problem such as the generation of plating needle deposition or less lead strength. There is also a problem in the bur eliminating method using electrolysis and high water pressure Namely, a thick bur can not perfectly be eliminated according to the method. In addition, the necessary bur eliminating process and facilities as above increases product cost.

SUMMARY OF THE INVENTION

The present invention eliminates the above described problems and a primary object of the present invention is to suppress the generation of bur as much as possible during the resin sealing process, and to dispense with a special bur eliminating process and facilities, without damaging the resin and the lead.

A lead frame according to the present invention comprises a die pad for mounting a chip placed in the central portion, inner leads, a tie bar and outer leads disposed around the die pad, a thin metal layer which is hard to melt and easily transformed, formed on the surface of that portion of the inner leads, outer leads and tie bar which are not covered by the sealing resin.

The thin metal layer of the present invention has less hardness so that it is transformed to fill the gap between the mold and the lead frame when the lead frame is clamped with the mold in the molding process. When the resin is injected into the cavity of the mold, the resin hardly enters the gap between the mold and the lead frame since the thin metal layer occupies the gap. Consequently, undesired generation of the bur can be prevented.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
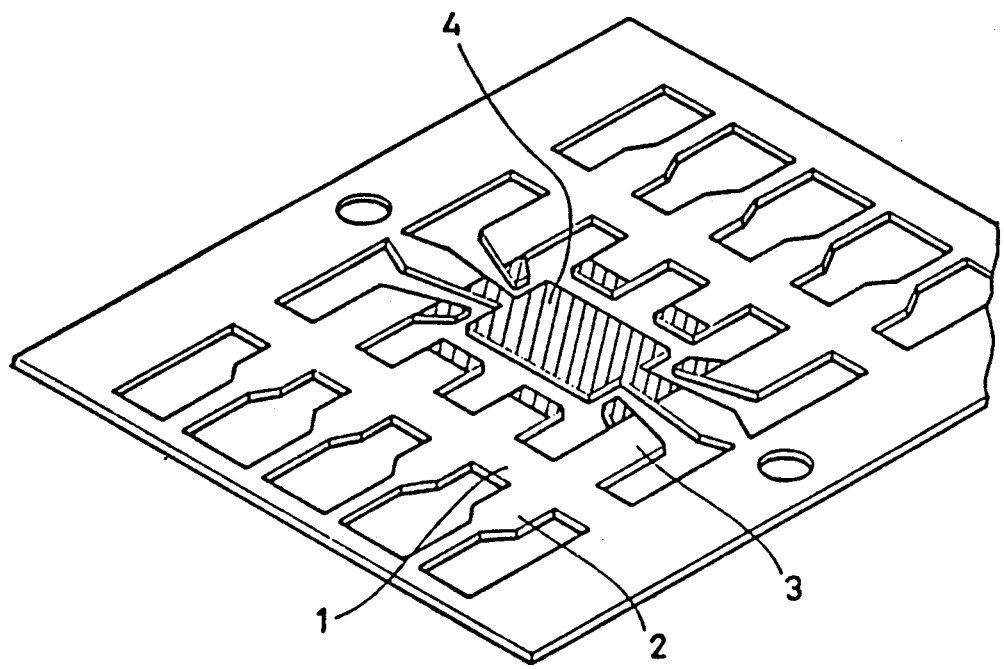
FIG. 1 is a perspective view of a conventional lead frame.
Figure 2:
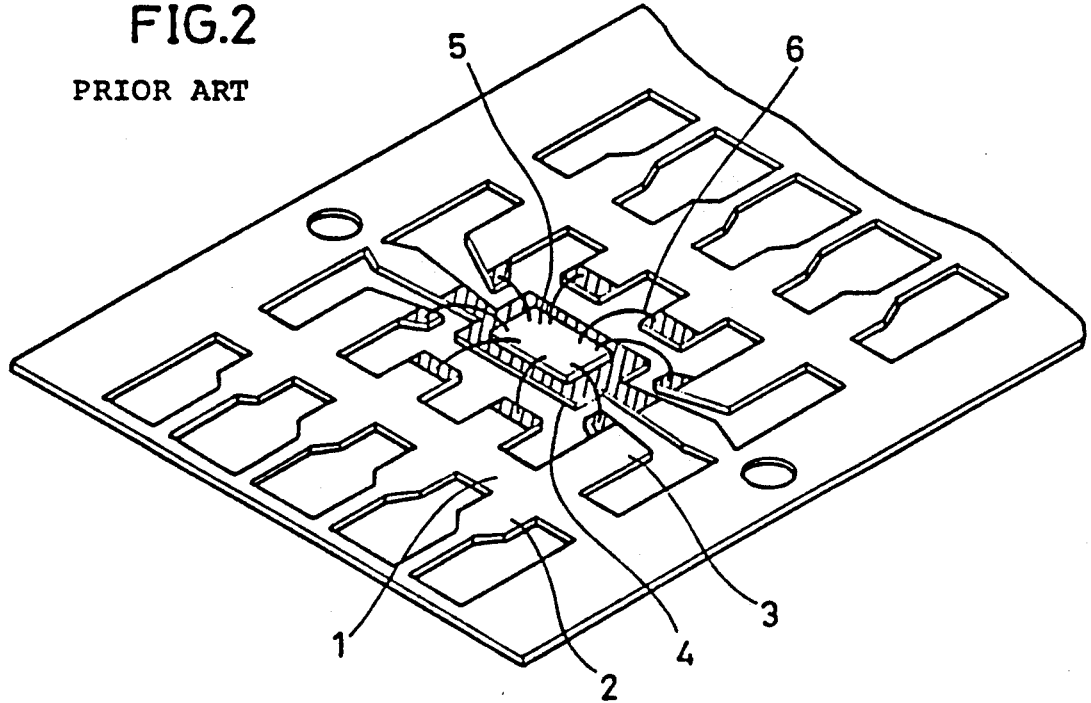
FIG. 2 is a perspective view showing a step of a method for manufacturing a semiconductor device using the conventional lead frame of FIG. 1.
Figure 3:
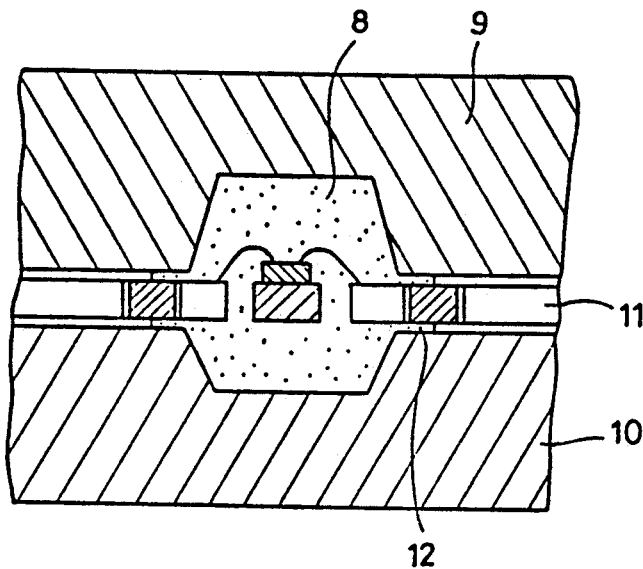
FIG. 3 is a cross sectional view showing another step of the manufacturing method using the conventional lead frame.
Figure 4:
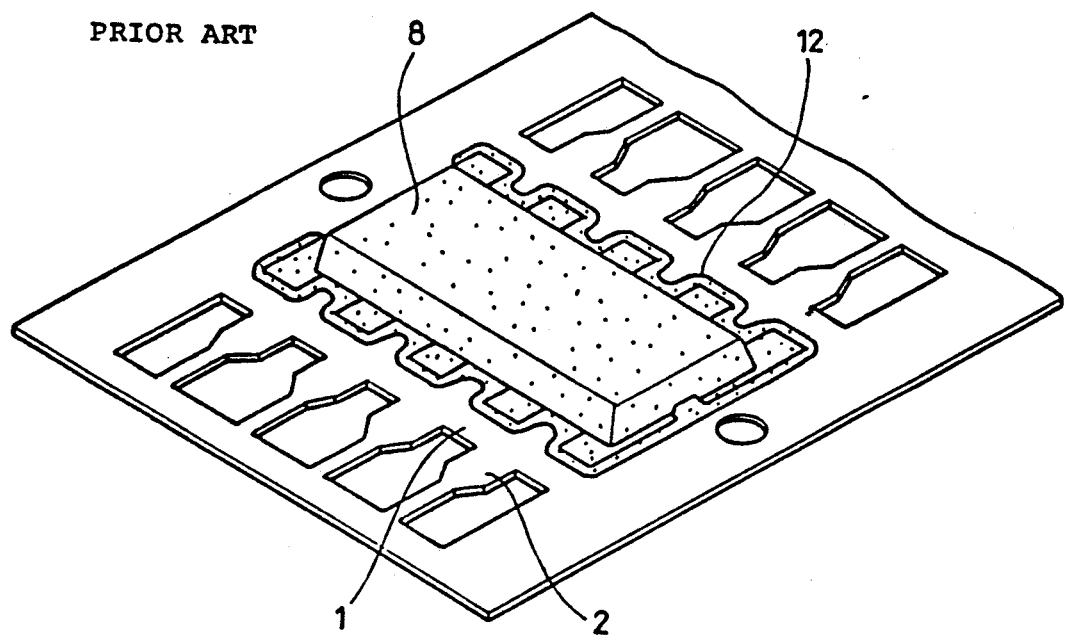
FIG. 4 is a perspective view showing a further step of the manufacturing method using the conventional lead frame.
Figure 5:
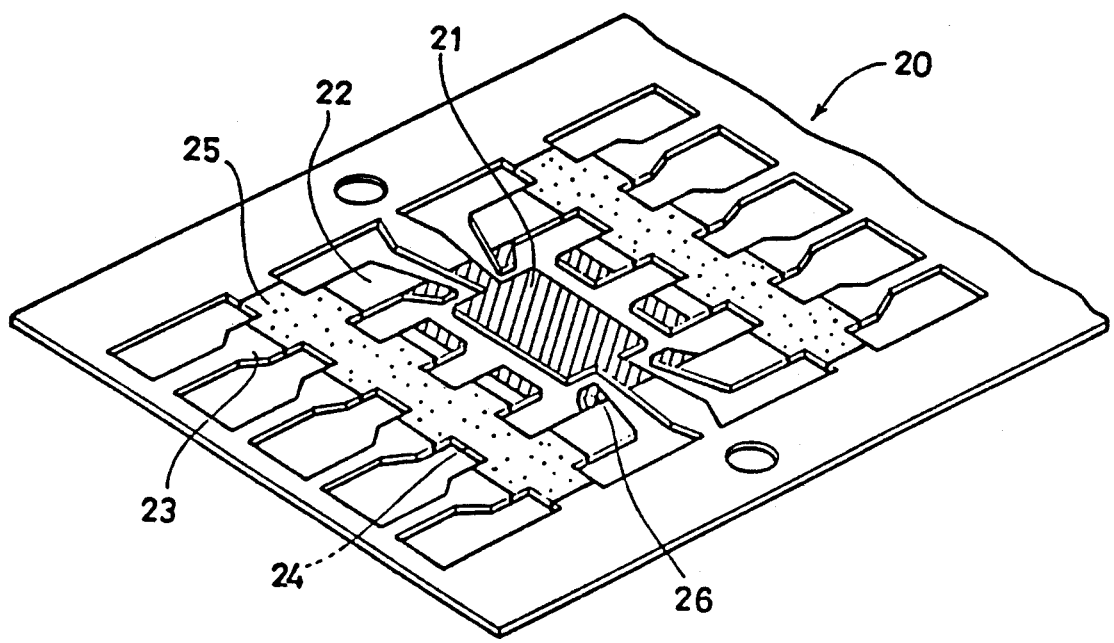
FIG. 5 is a perspective view showing a step of a method for manufacturing a semiconductor device using a lead frame of one embodiment of the present invention.

According to FIG. 5, a lead frame 20 is formed of a thin metal plate and it has a prescribed pattern formed by etching or pressing The lead frame 20 has a die pad 21 for mounting a chip in the central portion. A plurality of inner leads 22 are disposed around the die pad 21 with spacing between each other. A plurality of outer leads 23 are formed around the inner leads 22. The inner leads 22 and the outer leads 23 are connected integrally by a tie bar 24.

Lead plated portions 25 are formed on the surface of those portions of the inner leads 22, the outer leads 23 and the tie bar 24 which will not be covered with the sealing resin (package) in the subsequent molding process. The lead plated portions 25 are formed on the upper surface, the rear surface and the side of the inner leads 22, the outer leads 23 and the tie bar 24 from the external periphery of the sealing resin which is provided in the subsequent process to the portion slightly extending over the tie bar 24. The range usually corresponds to that range of the final product which remains exposed with no covering of the sealing resin. The plating thickness of the lead plating portion 25 is in the range of about $1\mu \sim 20\mu$, according to the dimension accuracy of the mold or the lead frame and to the pressure of clamping of the press. A range of $5\mu \sim 10\mu$ is preferable.

Referring to FIG. 5, the hatched portions are the Ag or Au plated portions 26 which facilitate the junction of the semiconductor chip and the connection between the electrodes of the semiconductor chip and the inner leads 22 by, for example, Au wires. The above described lead plated portions 25 can be more easily formed by simultaneously plating in the plating process of the plated portion 26.

Next, a method for manufacturing a semiconductor device using the said lead frame 20 will be described.

Figure 6:
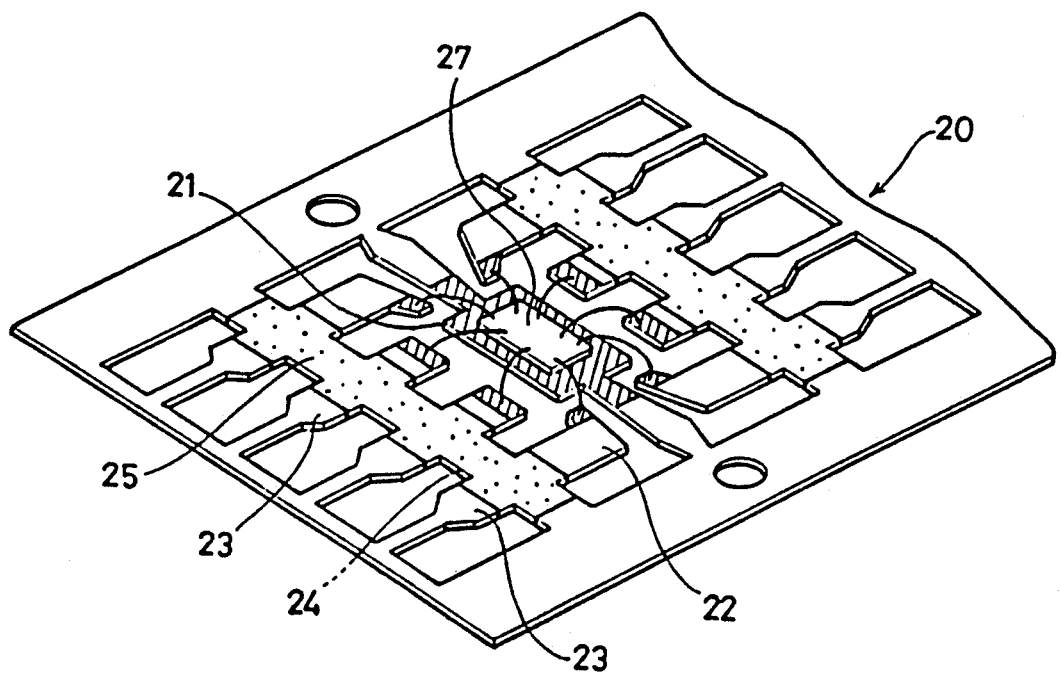
FIG. 6 is a perspective view showing another step of the manufacturing method using the lead frame of the present invention.

First, a semiconductor chip 27 is attached to the die pad 21 in the central portion of the lead frame 20 of FIG. 5, as shown in FIG. 6, and then fine wires 28 (e.g. Au) are applied to electrically connect the electrode of the chip 27 and the inner leads 22. The junction temperature of the semiconductor chip 27 is about 200° C. when resin junction is carried out, while the junction temperature of the fine wire 28 is about 250° C.

Figure 7:
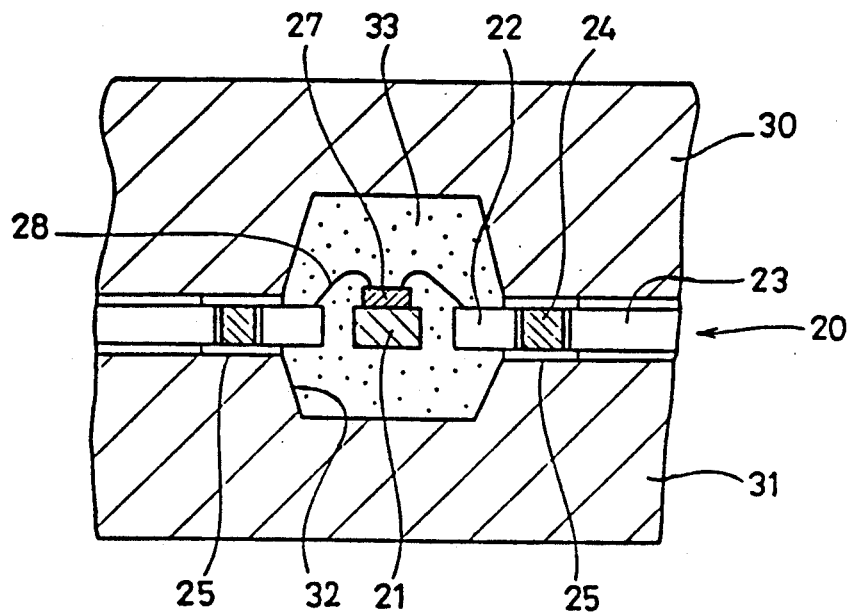
FIG. 7 is a cross sectional view showing a further step of the manufacturing method using the lead frame of the present invention.

Then, as shown in FIG. 7, the lead frame 20 is interposed between the upper mold 30 and the lower mold 31 of the metal mold. Then, a thermosetting resin such as epoxy resin is injected in the cavity 32 using, for example, the low pressure transfer molding, forming a resin layer 33. The temperature of the mold is about 180° C. at the time of resin sealing.

Now, the melting point of the lead is 327° C., so that the lead plated portions 25 do not melt during the manufacturing process. Meanwhile, lead has less hardness so that it is easily transformed when the lead frame 20 is pressed by the mold and it eliminates the gap between the mold and the lead frame 20. Therefore, the lead plated portions 25 occupy the gap between the metal mold and the lead frame 20, preventing entrance of the introduced resin. Consequently, the undesired bur is not generated at that portion. Namely, the lead plated portions 25 occupy the gap between the lead frame 20 and the upper mold 30 and the lower mold 31 by the deformation due to the clamping pressure of the press, preventing the out flow of the resin which otherwise forms the bur. Meanwhile, if the resin outflows between the lead plated portion 25 and the mold, the bur will be deposited on the lead plated portion 25.

Figure 8:
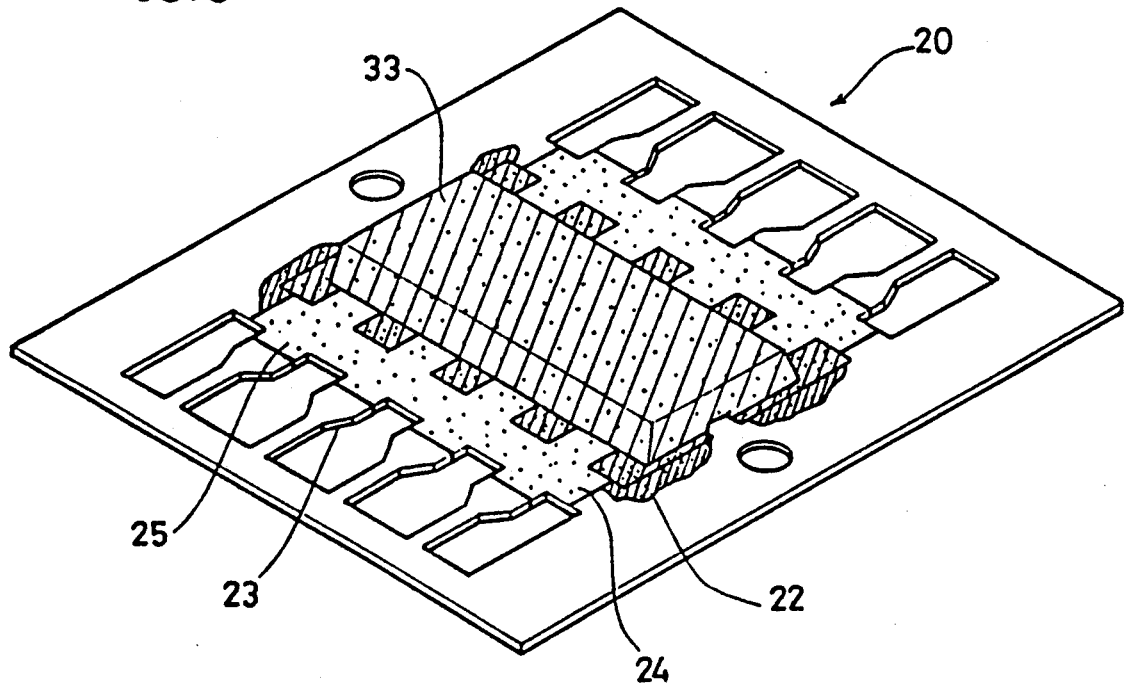
FIGS. 8 and 9 are perspective views showing the resin sealing process.
Figure 9:
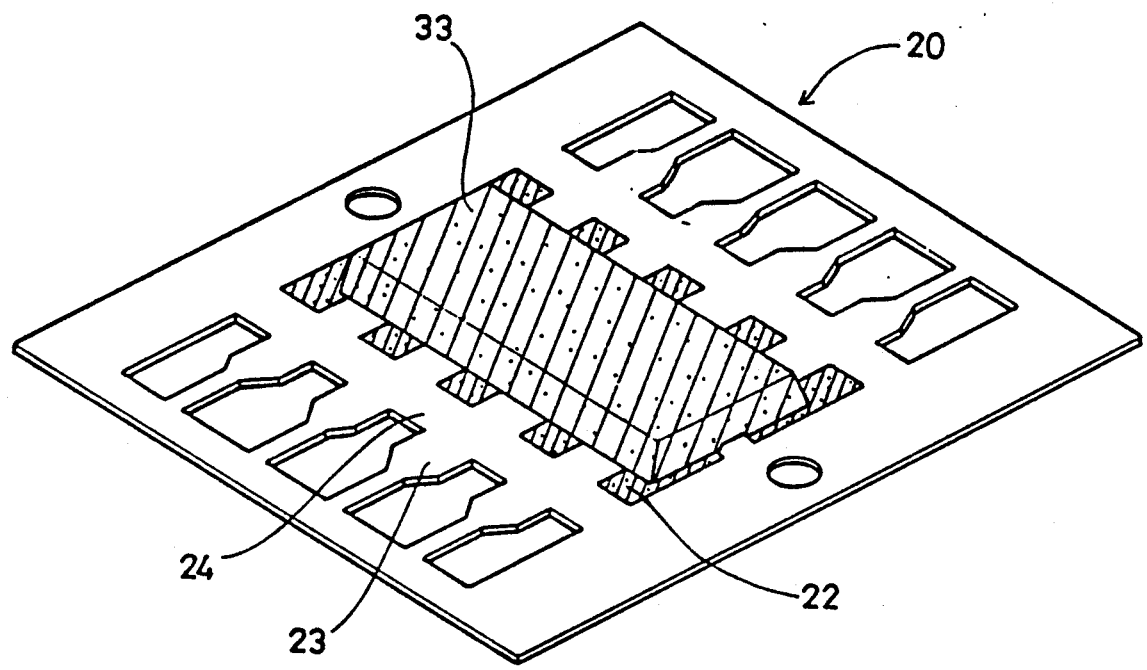

After the resin sealing, usually a solder plating is carried out on the outer leads 23 in order to enhance the facility of lead soldering. During this process, by dipping the lead plating into a solution for pealing or removing the layer (15% solution of nitric acid), the lead plating can be easily removed and, at the same time, the bur deposited on the lead plating is completely eliminated. FIG. 8 is a perspective view of the lead frame 20 after the molding process. When this structure is subjected to the peeling process, the lead plated portions 25 on the leads 22, 23 and the tie bar 24 are completely eliminated as shown in FIG. 9. Even if the resin is deposited on the lead plated portions 25, it will be completely eliminated with the melting of the lead plated portions 25.

As described above, by providing a soft thin metal layer such as lead on the lead frame of the resin outflowing portion during the resin sealing of the manufacturing process of a semiconductor device, the generation of burs during the sealing process can be prevented and, if there is a little outflow, it will be completely eliminated during the peeling process of the plating process. In addition, conventional bur eliminating processess and facilities such as honing can be eliminated.

Although lead is used as a plating material in the above described embodiment, other metals (for example Ag, Sn) can used. The melting temperature of these metals must be greater than the temperature of the semiconductor chip junction, the fine wire junction for electrically connecting the electrodes of the semiconductor chip and the inner leads, and the sealing resin. They must also have a hardness such that they are easily deformed when the lead frame is pressed by the metal mold during the molding process. Although plating is employed in the above described embodiment as a method for depositing lead onto the lead frame 20, other method such as pressure welding of a thin film or frame coating can be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device, comprising the steps of:
    preparing a lead frame for a semiconductor device, said lead frame including a die pad disposed in a central portion for mounting a chip; an inner lead, a tie bar and an outer lead disposed around the die pad; disposing a thin metal layer on surface areas of the inner lead, the outer lead and the tie bar which predetermined surface areas are not to be covered with sealing resin and which surface areas surround another surface area on which sealing resin is to be disposed;
    mounting a semiconductor chip on said lead frame;
    clamping said lead frame containing the semiconductor chip between an upper mold and a lower mold of a metal mold so that gaps between said lead frame and said upper mold and said lower mold are filled with and by deformation of said thin metal layer deformed by the clamping pressure;
    injecting the resin material into a cavity of said metal mold containing and to cover said another surface area, at a temperature which is less than the melting temperature of said thin metal layer;
    ejecting said resin molded lead frame out of said metal mold; and
    removing said thin metal layer from said lead frame.

2. A method for manufacturing a semiconductor device according to claim 1 wherein said step of removing said thin metal layer includes the step of dipping the lead frame into a solution for removing said thin metal layer before solder plating of the lead frame.

3. A method for manufacturing a semiconductor device according to claim 2, wherein said thin metal layer is a layer of lead and, said solution for removing the layer is a 15% solution of nitric acid.

* * * * *